United States Patent [19]
Bedouani

[11] Patent Number: 5,592,116
[45] Date of Patent: Jan. 7, 1997

[54] ADJUSTABLE DELAY CIRCUIT

[75] Inventor: Mohamed Bedouani, Viroflay, France

[73] Assignee: Bull S.A., Louveciennes, France

[21] Appl. No.: 417,258

[22] Filed: Apr. 5, 1995

[30] Foreign Application Priority Data

Apr. 13, 1994 [FR] France ................... 94 04331

[51] Int. Cl.⁶ .................... H03K 5/13; H03K 17/28
[52] U.S. Cl. .................. 327/276; 327/278; 327/285; 327/288
[58] Field of Search .................. 327/261–264, 327/266, 269–272, 274, 278, 280, 281, 285, 287, 288

[56] References Cited

U.S. PATENT DOCUMENTS

| | | | |
|---|---|---|---|
| 3,675,133 | 7/1972 | Frankeny et al. | 327/276 |
| 3,728,719 | 4/1973 | Fish | 340/347 |
| 4,176,344 | 11/1979 | Saari et al. | 340/347 |
| 4,521,765 | 6/1985 | Wang et al. | 340/347 |
| 4,647,906 | 3/1987 | Naylor et al. | 340/347 |
| 4,719,365 | 1/1988 | Misono | 327/269 |
| 4,795,923 | 1/1989 | Dobos . | |
| 4,797,586 | 1/1989 | Traa . | |
| 4,800,365 | 1/1989 | White et al. | 341/119 |
| 4,845,390 | 7/1989 | Chan | 327/278 |
| 4,943,748 | 7/1990 | Watanabe et al. | 327/262 |
| 5,272,729 | 12/1993 | Bechade et al. | 327/261 |
| 5,327,031 | 7/1994 | Marbot et al. | 327/278 |
| 5,381,063 | 1/1995 | Erhart et al. | 327/288 |

FOREIGN PATENT DOCUMENTS 0306662  3/1989  European Pat. Off. .

Primary Examiner—Terry Cunningham
Assistant Examiner—T. Lam
Attorney, Agent, or Firm—Kerkam, Stowell, Kondracki & Clarke, P.C.; Edward J. Kondracki

[57] ABSTRACT

The subject of the invention is an integrated delay circuit (10), including two amplifiers (11a, 11b), furnishing different delays, and having a common input, and a control block (12) connected to two terminals of the two amplifiers, respectively, in order to vary the phase offset between the two amplifiers. This circuit is integrated into a III-V semiconductor, such as gallium arsenide.

13 Claims, 5 Drawing Sheets

ADJUSTABLE DELAY CIRCUIT

BACKGROUND OF THE INVENTION

1. Field of the Invention

The invention relates to an integrated delay circuit, more particularly an integrated delay circuit adapted to very high speeds, for instance greater than 1 Gigabit per second, and more particularly suitable for integration into a III-V semiconductor such as gallium arsenide (GaAs). In this application, the delay circuit may be made of field effect transistors, and especially those of the MESFET (metal semiconductor field effect transistor) and then more particularly suited for logic of the DCFL type (direct-coupled FET logic) including BDCFL (buffered DCFL). It may also be made with field effect transistors of the HEMT type (high-electron-mobility transistor) that are integrated into a ternary semiconductor material, such as gallium arsenide and aluminum, of the AlGaAs/GaAs type, for example. It will be seen as well that the invention is equally applicable to differential amplifiers, with bipolar transistors but more advantageously with MESFET transistors with SCFL logic (source-coupled FET logic). The delay circuit according to the invention can easily be linearly adjusted and is applicable more particularly to very high-speed transmission systems and to information processing systems that also employ very high-speed transmissions.

2. Description of the Related Art

Delay circuits including an amplifier, one terminal of which is connected to a central block controlling the variation in the delay by adjusting the current furnished by the amplifier, are well known and widely used. The control blocks are currently made of RC circuits, and adjustment of the delay is done by varying the value of the resistance and/or the capacitance of the RC circuits. In an integrated circuit with field effect transistors, for example of the MOS type (metal oxide semiconductor), the resistance and the capacitance are ordinarily constituted by transistors.

The disadvantage of such delay circuits is the exponential curve in the variation of the delay with respect to the variation in the values of R and C. The linearity of the delay adjustment accordingly requires RC products with high values, which are incompatible with very short delay times. On the other hand, the RC circuits must be inserted between input and output buffer circuits in order to make the external circuits insensitive to the variations in R and C. Furthermore, the technology for manufacturing field effect transistors produces pronounced drift in the characteristics of the transistors of different integrated circuits. This drift is an obstacle to the reliability and sensitivity of the current adjustment sought.

In certain cases, such as the very high frequency phase-locked loop circuit described in European Patent Disclosure EP 0 441 684 and the high-output digital transmission system described in European Patent Disclosures EP-A 0 466 591, EP-A 0 466 592 and EP-A 0 466 593, it is currently necessary to use very short adjustable delays. By way of example, the aforementioned circuit and system may require delays that are adjustable by increments of only a few picoseconds each. Moreover, the linearity in the variation of these delays is a condition that facilitates control and considerably improves its performance. On the other hand, these delay circuits must be very compact and highly adaptable to high-speed technologies, such as those made with field-effect transistors and more particularly those integrated into a III-V semiconductor. In this latter application, DCFL logic offers the advantage of very simple and very fast logic gates, made of only two transistors connected in series between the supply potentials, and of low energy consumption at a low supply voltage, ordinarily 2 V. On the other hand, it has the disadvantage of asymmetrical switching times, where the rise time is markedly different from the fall or decay time. BDCFL logic overcomes this disadvantage, at the cost merely of adding two further series-connected transistors between the supply potentials. Both these logic systems will be called the DCFL type.

Delay circuits made of complementary-type transistors are known, such as CMOS (complementary MOS) delay circuits. However, they cannot be transposed to DCFL-type logic, since that is not a logic made with complementary transistors. On the other hand, the present Applicant, in its European Patent Applications EP-A 0 493 149 and EP-A 0 493 150, has already described delay circuits made with differential amplifiers, making it possible to obtain substantially linear delays. These delay devices lend themselves well to bipolar ECL (emitter coupled logic) or CML (current-mode logic) technology, integrated into the monocrystalline silicon. However, these circuits cannot be transposed to logic of the DCFL type, since it does not have a differential structure.

SUMMARY OF THE INVENTION

The invention offers a solution that makes it possible to have a delay circuit that is adjustable with good linearity, is capable of furnishing very short delays by very fine increments, is adaptable to integration with a III-V semiconductor, and more particularly is suitable for logic of the DCFL type, can have a highly compact and reliable structure, and is capable of furnishing delays that extend over a very wide range.

The subject of the invention is an integrated delay circuit, characterized in that it includes two amplifiers, furnishing different delays, and having a common input, and control means connected to two terminals of the two amplifiers, respectively, in order to vary the phase offset between the two amplifiers, in order to vary the phase offset between the two amplifiers.

BRIEF DESCRIPTION OF THE DRAWINGS

The invention will become apparent from the detail description that follows, given by way of example and taken in conjunction with the accompanying drawings. In the drawings:

FIG. 1 presents a first exemplary embodiment of a delay circuit 10 made with MESFET transistors with mixed DCFL and BDCFL logic. The delay circuit 10 shown includes two amplifiers 11a and 11b, a delay control block 12, and an output buffer 13. The two amplifiers 11a and 11b have a common input that receives the input signal IN of the circuit 10, and two respective outputs A and B. The amplifiers 11a and 11b are each made with at least one DCFL inverter. A DCFL inverter is made up of an enrichment control transistor E and a depletion transistor D whose source is connected to its gate so as to function like a charge resistor. The drain-to-source paths of the two transistors D and E are connected in series between two supply potentials Vdd and Vss. In the example shown, Vdd represents ground, and Vss=−2 V; the amplifier 11a ia made of two successive DCFL inverters, and the amplifier 11b of 10 cascaded DCFL inverters. The control transistor E receives at its gate the input signal of the inverter and at its drain furnishes the output signal. By way of example, the dimensioning of the transistors D and E has been done as follows. If the electrical width and length of a transistor are designated as W and L, and if the subscript for the name of the corresponding transistor is assigned to them, then the ratio $B=(W_E/L_E)/(W_D/L_D)$ would be on the order of 10.

Figure 1:
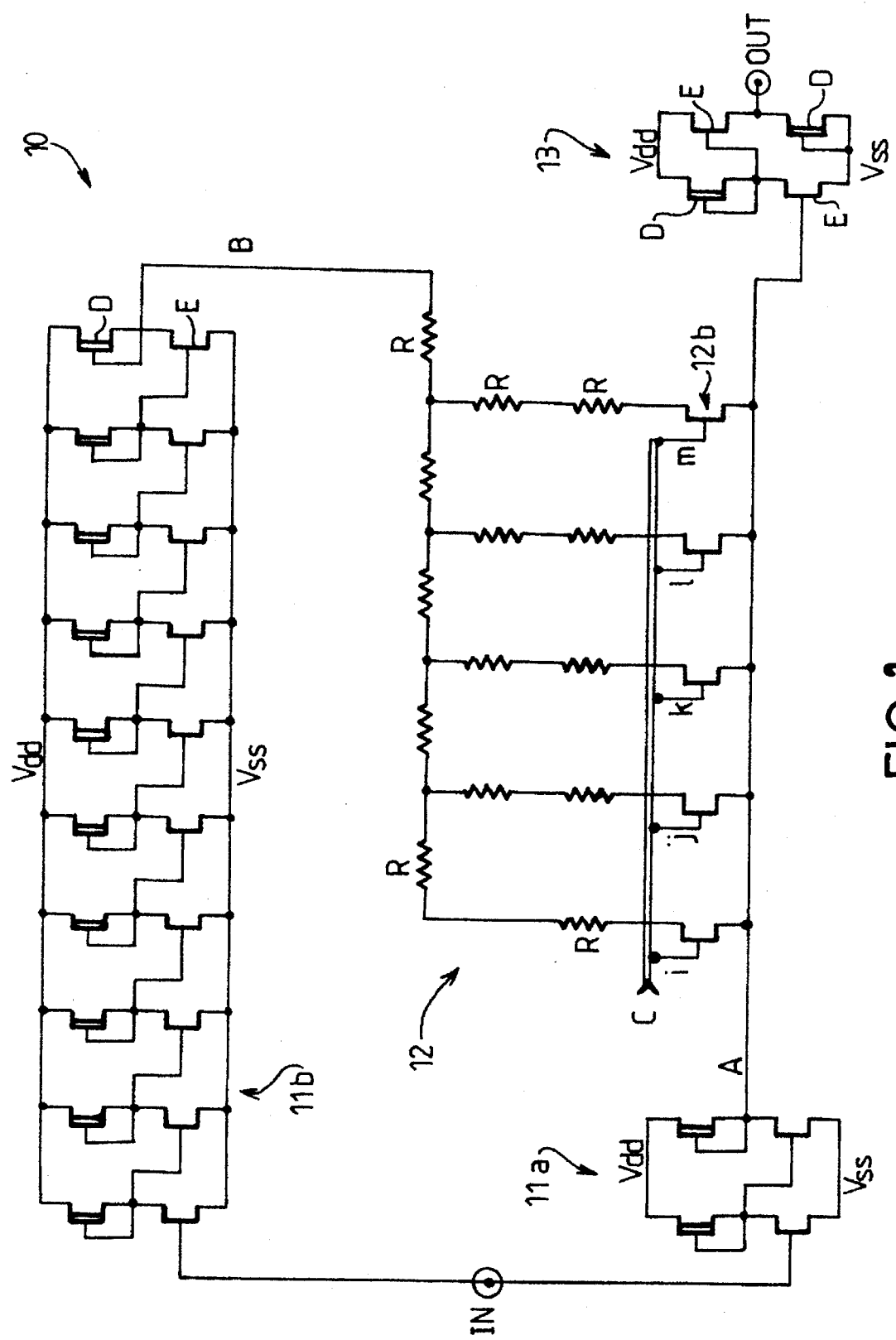
FIG. 1 schematically illustrates the structure according to the invention of a circuit with a linearly adjustable delay made with mixed DCFL/BDCFL logic.

The digital delay control block 12 of the example shown is made of a resistive iterative network (resistor ladder network) R-2R which in the conventional manner includes stages R-2R connected to respective switches actuated by a control signal. More precisely, the stages R-2R of the network 12 are connected to the respective outputs A and B of the amplifiers 11a and 11b and to the respective switches 12b controlled selectively by the digital control signal C. The switches 12b are made of enrichment field effect transistors, whose control gates receive the digital control signal C and whose sources are interconnected, jointly with the output, to the output A of the amplifier 11a. The final stage R-2R has the resistor R connected to the output B of the amplifier 11b, while the first stage is merely an R-R stage, for reasons given hereinafter. In order to attain a digital 32-increment adjustment of the global delay of the circuit 10, the network 12 includes five stages R-2R, and the control signal C is made up of five control bits distributed as five bits i, j, k, l, m, which are applied to the respective gates of the transistors 12b. Each switch transistor is made conducting by connecting its gate to the high potential Vdd. The switch transistors 12b are dimensioned so that the currents passing through the successive stages R-2R of the network 12 will be substantially equal to ½, ¼, ⅛, 1/16 and 1/32. These values are obtained by assigning the respective electrical widths 5 W, 4 W, 3 W, 2 W and W to the switch transistors, since the series resistance of a MESFET transistor is inversely proportional to the width of its gate.

The output buffer 13 is made of at least one BDCFL inverter—only a single one in the example shown. A BDCFL inverter is made with an input layer having the structure of a DCFL inverter and an output layer made by the series connection of an enrichment control transistor E, having its drain connected to the supply potential Vdd and its gate connected to the drain of the control transistor E of the input layer, and a depletion transistor D serving as a resistive charge whose source is connected to the gate and to the supply potential Vss and whose drain furnishes the output signal OUT. In practice, for the sake of adapting impedance, the ratio β between the transistors of the output layer is on the order of unity. In the example shown, the transistors of the input layer have a ratio β=5. The gate of the control transistor E of the input layer is connected directly to the common terminals of the switches 12b and to the output terminal A of the network 12.

Figure 2:
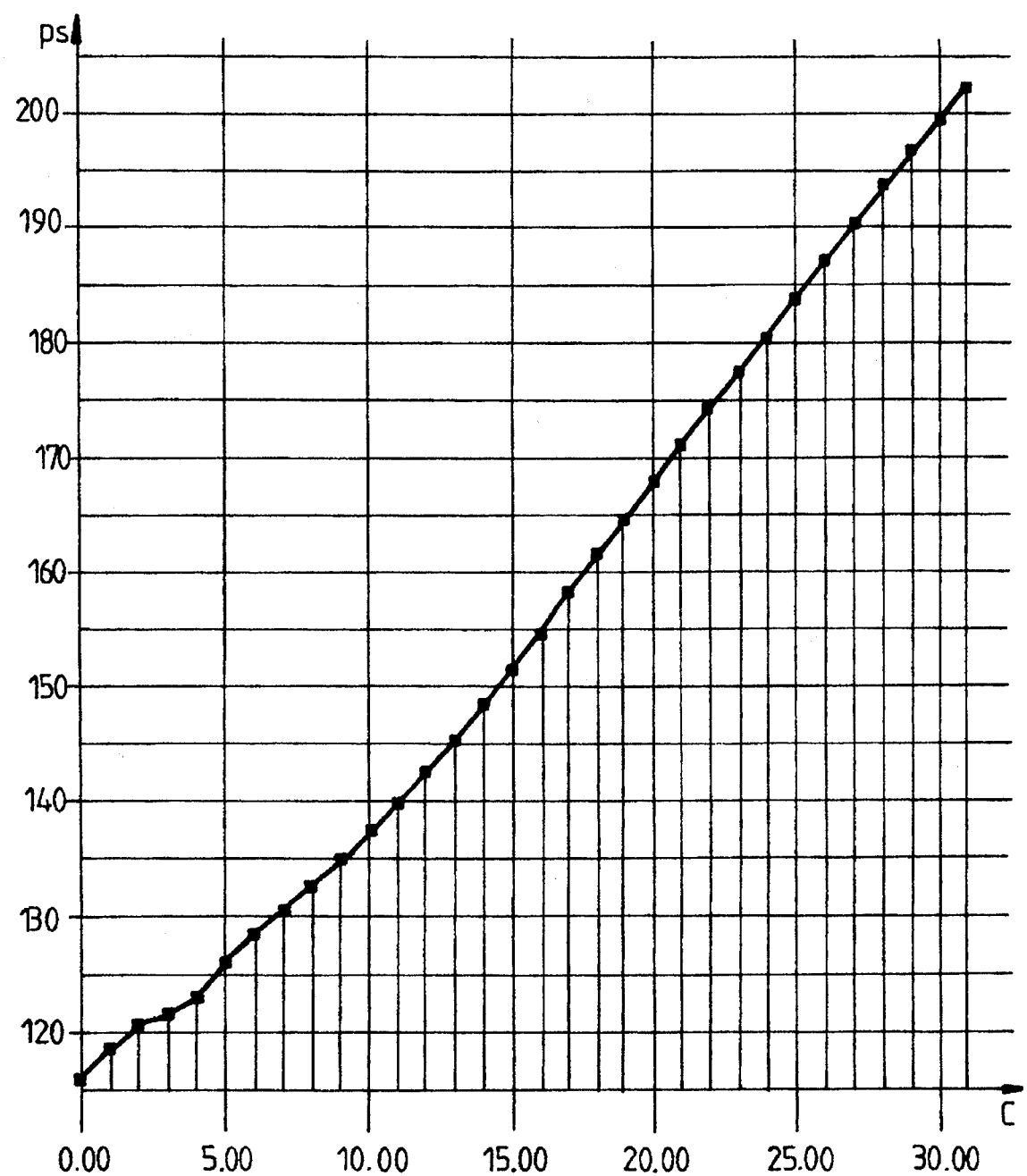
FIG. 2 is a graph illustrating the variation in the delay obtained from the delay circuit shown in FIG. 1.

The operation of the delay circuit 10 will be described with reference to the graph of FIG. 2, which shows the successive delays obtained between the input signal IN and the output signal OUT by means of a progressive variation of the control signal C in 32 increments. When the bits i–m are at the low level and have the logical value 0, all the switches 12b are open and thus isolate the amplifier 11b and the network 12 from the output buffer 13. Hence the signal IN travels through only the amplifier 11a and the output buffer 13. The delay between the signal IN and the signal OUT corresponds to the minimum delay of the circuit 10, which is 115 picoseconds in the example of FIG. 2. When all the bits i–m assume the value of logical 1, all the switches 12b are open and thus connect all the stages of the network 12 to the output B of the amplifier 11b. The last stage R-R, together with the resistor 2R of the next-to-last stage, forms a resistance equal to R, such that upon iteratively returning to the first stage, one finds the equivalent resistance of the network 12 to be equal to R. This is the minimum resistance of the network R that will output the most current from the output B of the amplifier 11b and which determines the longest delay provided by the amplifier 11b, to which the constant delay of the amplifier 11a is added. The maximum delay corresponding to increment 32 of the control signal C, in the example shown, becomes 203 picoseconds. It can be seen from FIG. 2 that the variation is close to a straight line, being curved inward slightly between values 5 and 17 of C and with a more pronounced bend at values 3 and 4 of C. The increments are as fine as approximately 3 picoseconds. The advantage of the network 12 is to offer a monotonal, quasi-linear control of delay between a minimum value Tmin, fixed by the amplifier 11a, and a maximum value Tmax, determined by the fixed value Tmin and the maximum delay that the amplifier 11b and the network 12 can provide. In general, if the control signal C is made of a number N of control bits (C={0, . . . , $2^{1-N}$}), then the delay is controlled linearly by increments, each of (Tmax−Tmin)/$2^N$. In other words, there is a progressive delay T=Tmin+ (Tmax−Tmin)C/$2^N$, where C={0, . . . , $2^{2-N}$}. In reality, the slight distortion observed in the curve of FIG. 2 is due essentially to the fact that the equivalent resistance of the network 12 is not always constant when C varies between its two extreme values. On the other hand, since the amplifiers 11a and 11b are made with DCFL logic, they make it possible to obtain short delays and to have a simple and very compact structure, while the asymmetry in the switching time is corrected by the BDCFL logic output buffer 13. Moreover, it has been seen that in the network 12, the stages will admit respective predetermined current intensities (½, ¼, ⅛, 1/16, 1/32) under the respective control of the five control bits i–m of the control signal C. Thus the control signal C constitutes a digital control in a summed linear mode. Certainly, other controls and other structures of the network 12 may be employed by one skilled in the art. In particular, the amplifiers may all be made of DCFL or BDCFL logic, and the fineness of the increments may be adjusted by the number of bits of the control signal C, where six bits, for example, make it possible to have 64 increments. Furthermore, the network 12 may be adapted to a nonlinear type of variation.

Figure 3:
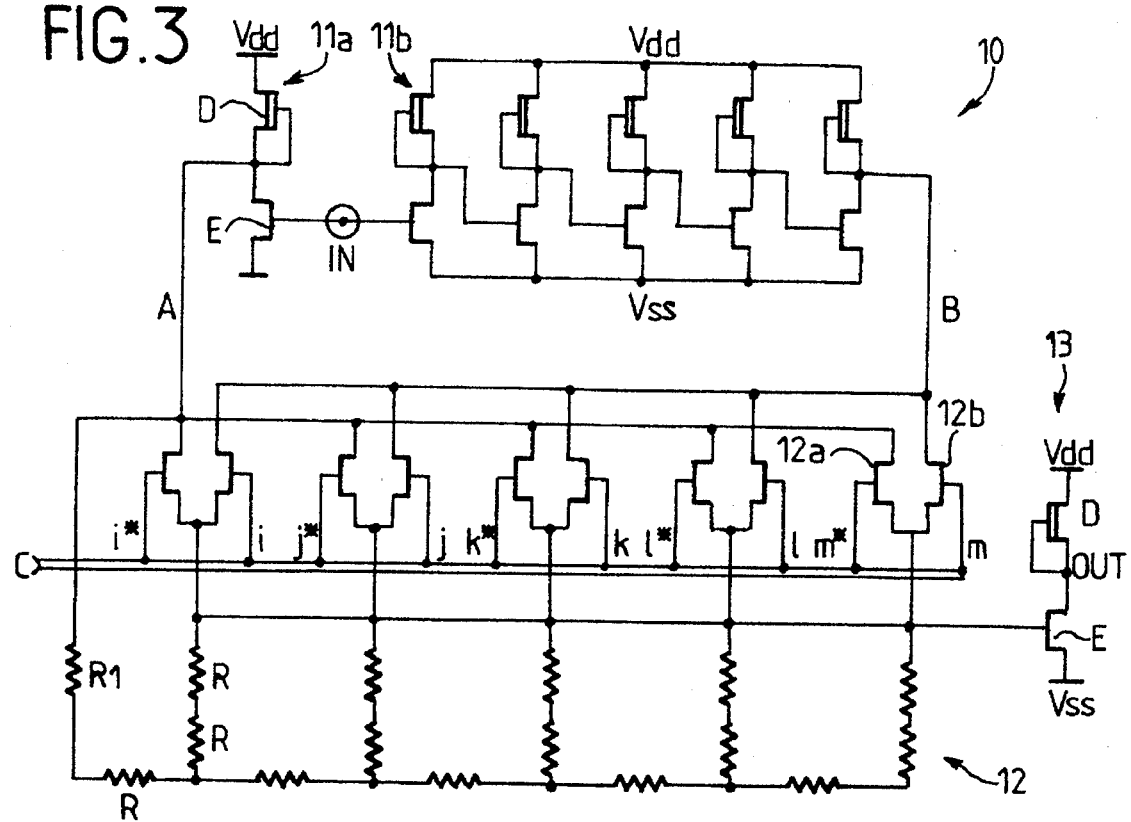
FIG. 3 schematically illustrates a variant according to the invention of a linear adjustable delay circuit made with DCFL logic.
Figure 4:
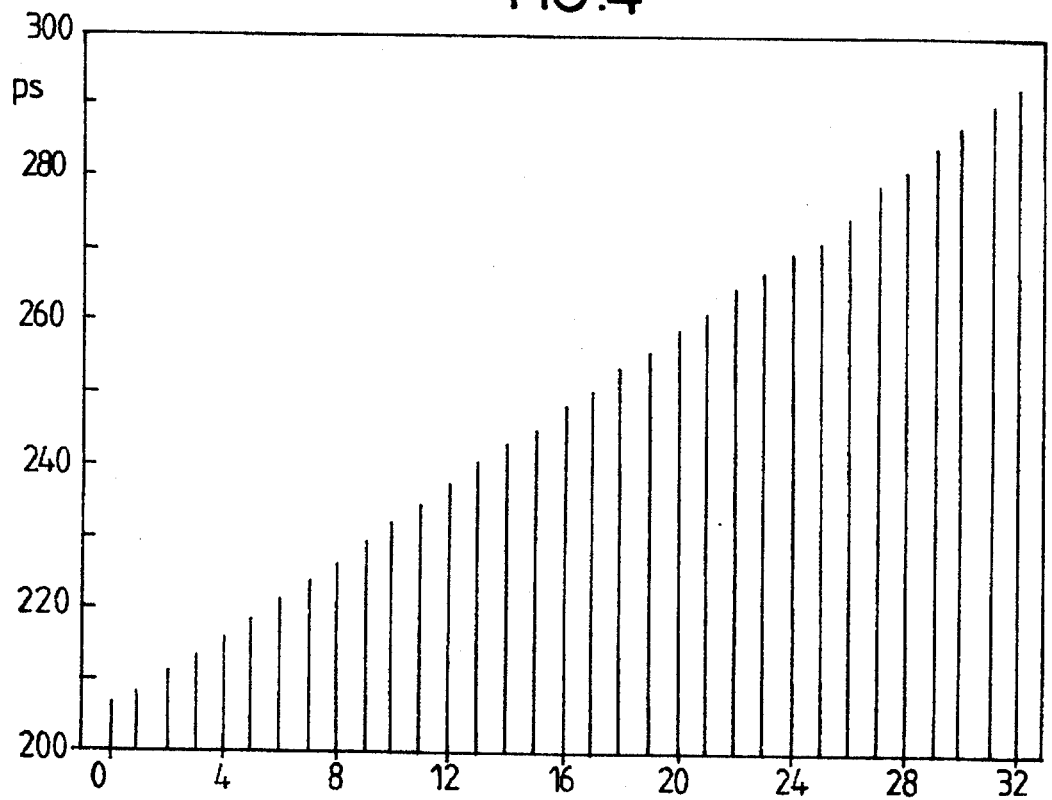
FIG. 4 is a graph showing the variation in the delay obtained from the circuit shown in FIG. 3.

FIGS. 3 and 4 show another exemplary embodiment of a delay circuit 10 according to the invention, made of DCFL MESFET transistors. The amplifier 11a is made of a single DCFL inverter, and the amplifier 11b is made of five cascaded inverters. The network 12 is also made with five stages R-2R, and the output buffer 13 is made with a single DCFL inverter. However, the network 12 and its connection to the outputs A and B of the amplifiers and of the output buffer 13 are changed. The network 12 includes five switch transistors 12b, here connected between the respective branches 2R of the stages of the network and the output B of the amplifier 11b. The network in the same way includes five other switch transistors 12a, connected between the respective branches 2R and the output A of the amplifier 11A. The network is made of five stages R-2R and includes one additional resistor R1 that connects the free resistor R of the first stage R-2R to one of the outputs A or B, in this instance the output A, for reasons given below. The connections of the switch transistors 12a and 12b with the respective stages R-2R are joined together at the input of the output buffer 13. The control signal C includes the five control bits i–m applied to the gates of the transistors 12b and five other control bits i*–m* which are complementary to the bits i–m and are applied to the gates of the transistors 12a.

In operation, when all the bits i–m are at the low level and have the value of logical 0 (C=0), the switches 12b are all closed and thus isolate the long-delay amplifier 11b. The complementary bits i,-m, have the value of logical 1, and so all the switches 12a are open and connect all the stages R-2R to the output A of the short-delay amplifier 11a. The minimum delay Tmin of the circuit 10 accordingly corresponds to this state. In this state, the equivalent resistance of the network 12 is equal to 88R/87, or in other words approximately the value of R. Conversely, when all the bits i–m have the value of logical 1 (C=32), all the switches 12a are closed and isolate the amplifier 11a while all the switches 12b are open and connect all the stages of the network 12 to the output B of the long-delay amplifier 11b. That state accordingly corresponds to the maximum delay Tmax furnished by the delay circuit 10. Between the two cases, for example when the most-significant bit i switches to the value of logical 1 and the other remain at 0 (C=16), only the corresponding switch 12b is open, while only the corresponding switch 12a is blocked. The situation is the reverse where C=15. In order to preserve a resistance of the network 12 equivalent to R, the resistor R1=R is added. The principle of operation is thus apparent from this description. The network preserves a resistance substantially equal to R, at which a constant current I is accordingly output that originates in the two amplifiers 11a and 11b in complementary fashion. This assures very good linearity, as FIG. 3 shows. In FIG. 3, the delays vary between approximately 207 and 292 picoseconds, with 32 increments each on the order of 2 to 3 picoseconds.

Figure 5:
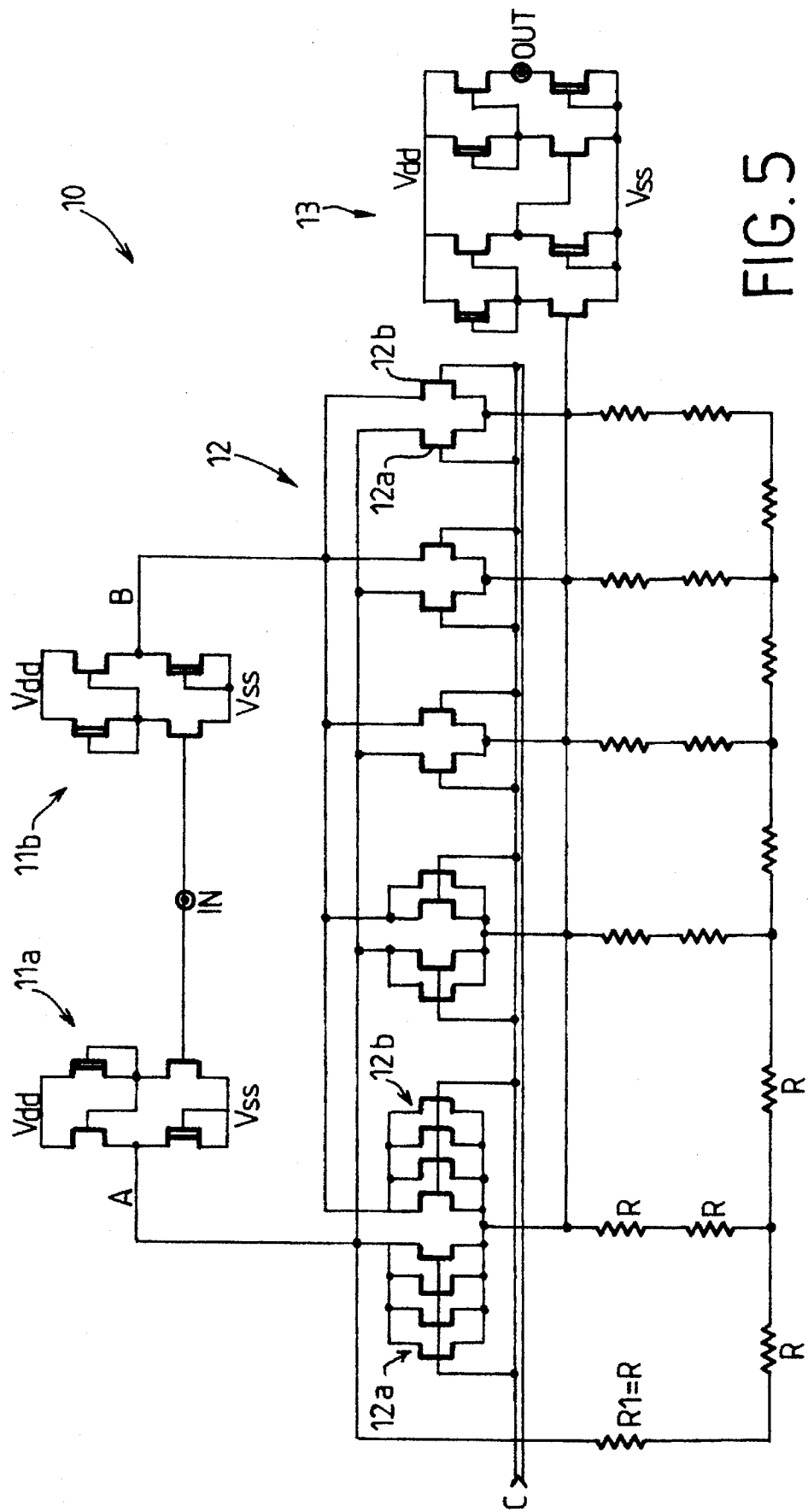
FIG. 5 illustrates another variant according to the invention of a linearly adjustable delay circuit made with BDCFL logic.

FIG. 5 shows another exemplary embodiment of a delay circuit 10 according to the invention, made with BDCFL logic MESFET transistors. The delay circuit 10 schematically shown in FIG. 5 is similar to that of FIG. 3 and includes the two amplifiers 11a and 11b, the network 12 provided with switches 12a and 12b receiving the digital control signal C composed of 10 control bits i–m and i*–m*, and the output buffer 13. Unlike the circuit of FIG. 3, the amplifiers 11a and 11b and the output buffer 13 are made of BDCFL inverters, having the same structure as the output buffer 13 in the circuit 10 of FIG. 1. The amplifiers 11a and 11b shown are each made with a single inverter but have different propagation times. In the exemplary embodiment shown, the transistors of the input layer of the two inverters had the dimensions $W_D/L_D=2/1$ and $W_E/L_E=10/1$; on the other hand, in the output layer, $W_D/L_D=2.4/1$ and $W_E/L_E=2.8/1$ in the amplifier 11a, while in the amplifier 11b, $W_D/L_D=5.6/1$ and $W_E/L_E=6/1$. The output terminals A and B of the input amplifiers 11a and 11b are connected on the one hand to the potential Vss by way of two respective diodes, whose cathode is at the potential Vss, so as to block the output tension to approximately 0.8 V, and on the other to the two respective terminals of the switches 12a and 12b. The output buffer 13 includes two BDCFL cascaded inverters. Because BDCFL logic is used, the delays are substantially the same during both the rise and the fall times.

Figure 6:
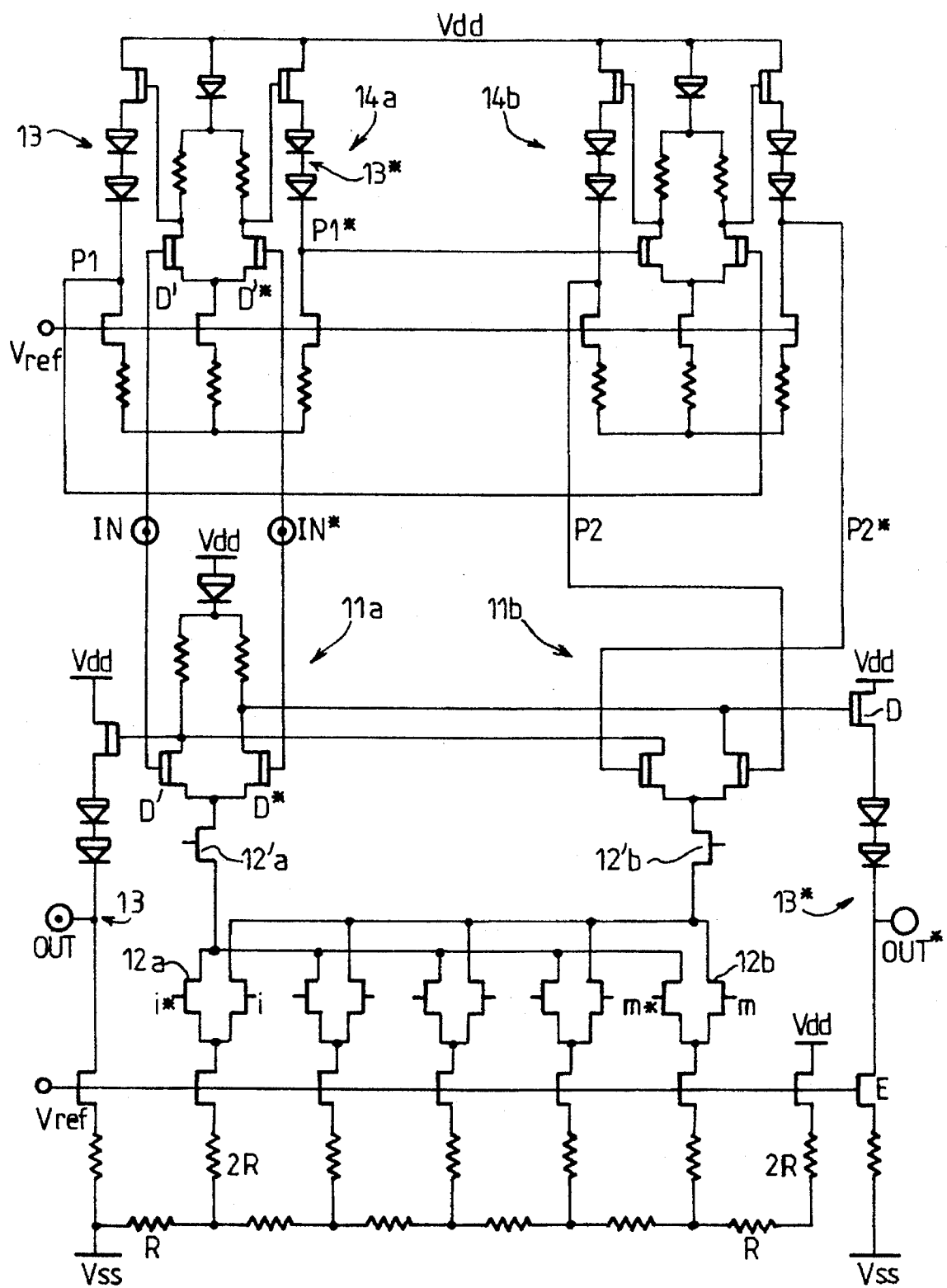
FIG. 6 illustrates yet another variant according to the invention of a linearly adjustable delay circuit having a differential structure.

FIG. 6 relates to a fourth exemplary embodiment of the invention. In FIG. 6, the delay circuit 10 is made using SCFL logic (source-coupled FET logic). The structure of the circuit 10 is similar to that in FIG. 3, but here it corresponds to a differential structure and includes two complementary inputs IN and IN*, two differential amplifiers 11a, 11b, an iterative network 12 with six stages R-R2 and pilot-controlled by the digital control signal C made up of 10 control bits (i–m, i*–m*), and two complementary output buffers 13 and 13*. It further includes two fixed-delay buffer amplifiers 14a and 14b connected in series and each provided with two complementary output buffers 13 and 13'. In this logic, the variable-gain amplifiers 11a and 11b and the fixed-delay amplifiers 14a and 14b are similar to differential amplifiers and have a well-known structure, made with two symmetrical depletion transistors D and D* having their sources in common. The drains of the two transistors D and D* are connected to two respective charge resistors joined so as to be connected to the supply potential Vdd by way of a diode. The respective buffers 13 and 13* are formed of a depletion transistor D, at least one diode, an enrichment transistor E, and a resistor, which are connected successively in series between the potentials Vdd and Vss. In the amplifiers 11a and 11b, the drains of the transistors D and D* are connected to the respective gates of the transistors D of the buffers 13 and 13*. The complementary outputs OUT and OUT* are furnished at the level of a cathode of one diode of the two respective buffers 13 and 13*, in this case the diode close to the drain of the transistor E, as shown. The network 12 shown includes six constant current sources S, each formed by one enrichment transistor E controlled by a common reference voltage Vref and five pairs of switches 12a, 12b formed of enrichment transistors controlled by the signals i*–m* for respective switches 12a and l–m for the respective switches 12b. The sources of each pair of transistors 12a and 12b are connected to a respective branch 2R of the network 12 by way of a corresponding current source transistor S, while the drains are connected respectively to the common sources of the amplifiers 11a and 11b, through two transistors 12'a and 12'b controlled by a fixed voltage, not shown, so as to be made conducting and being capable of being omitted. The branch 2R of the sixth stage is connected by a current source transistor S to the supply potential Vdd in order to lend the network 12 a substantially constant equivalent resistance. The common reference potential Vref is also applied to the gates of the current source transistors of the amplifiers 14a and 14b and of the transistors E of all of the buffers 13 and 13*.

The principle of operation is similar to that of the circuit 10 in FIG. 1. The variable-gain input amplifier 11a, at its gates of the transistors D and D*, receives the complementary input signals IN and IN*, which are also applied to the inputs of the fixed-gain input amplifier 14a. The intermediate output signals P1 and P1* that the fixed-delay buffer amplifier 14a furnishes are applied to the respective gates of the transistors D* and D of the second, fixed-delay buffer amplifier 14b. The intermediate output signals P2 and P2* that the buffer amplifier 14b furnishes are applied to the gates of the respective transistors D and D* of the second amplifier 11b. Assuming that the intermediate transistors 12'a and 12'b are conducting, the states of the control bits i–m and i*–m* determine the delay between the complementary input signals IN, IN* and the complementary output signals OUT, in the same manner as in the circuits 10 of FIGS. 3 and 5. When the bits i–m have the state 0 and the bits i*–m* have the state 1, the amplifier 11b is blocked and the amplifier 11a is activated, with a minimum charge resistance representative of a maximum delay for this amplifier, but a minimum delay for the circuit 10. Conversely, if the bits i–m have the state 1, the amplifier 11a is blocked and the amplifier 11b, with the two buffer amplifiers 14a and 14b, is activated with a minimum charge resistance representative of a minimum delay for the amplifier 11b but a maximum delay for the circuit 10. The intermediate states prove to vary in a highly linear fashion.

In conclusion, the various exemplary embodiments shown highlight the fact that the subject of the invention is an integrated delay circuit 10, including two amplifiers 11a, 11b, furnishing different delays, and having a common input, and control means 12 connected to two terminals of the two amplifiers, respectively, in order to vary the phase offset between the two amplifiers. In the examples shown, the amplifier 11a is fast and the amplifier 11b is slow.

The control means may be adapted to the type of control chosen. To obtain a digital control, the controls means 12 preferably include an iterative network R-2R that includes switches controlled by a digital control signal C in order to select the stages of the iterative network. The switches are simple, like the switches 12b in FIG. 1 or may be paired like 12a, 12b and connected to said respective terminals of the two amplifiers. The control means may also be adapted to the type of variation chosen. To obtain a substantially linear variation with an iterative network R-2R, the switches are dimensioned so as to conduct into the stages of the iterative network a current substantially equal to $\frac{1}{2}^N$, where N represents the ordinal number of the stages in the network. Preferably, the control means preserve a substantially constant equivalent resistance; if not, means such as the branch R-R1 may be provided in order to lend the control means a substantially equal equivalent resistance except for the variation in the control signal. It has been seen that this circuit is very well adapted to integration with a III-V semiconductor material with field effect transistors using DCFL and/or BDCFL logic, in which case the control means are connected to the output terminals of the two amplifiers, However, it has also been seen that the two amplifiers may be differential amplifiers, including control means as an element of a current source, with the output of the delay circuit being constituted by a common output of the two amplifiers. In that case, it may be integrated with a III-V semiconductor material with field effect transistors (MESFET, HEMT) using SCFL logic. It may also be integrated into a monocrystalline semiconductor material, with field effect transistors, for instance CMOS type, or with bipolar transistors. The invention relates to a delay circuit as defined above.

Moreover, it will be appreciated from FIG. 1 that the amplifier 11a may be omitted. However, the principle of operation would be quite different from that described. The network 12 would then be one means for causing the gain of the amplifier 11b to vary. The operation could then be in accordance with conventional delay circuits. That operation could also be obtained from the delay circuit 10 shown in FIG. 6, with a single amplifier 11a or 11b, or with the two amplifiers controlled in alternation by complementary controls at the gates of the transistors 12'a and 12'b, in order to obtain two respective ranges of variation in the delay. It is understood that other amplifiers could be added, in a well known manner, in order to increase the number of ranges.

I claim:

1. An integrated delay circuit (10), comprising:

two amplifiers (11a, 11b) having a common input for receiving an input signal (IN) and respective first and second output terminals for providing corresponding output signals (A,B) differently delayed with respect to said input signal, and a resistive-ladder network (12) having first and second terminals respectively connected to said first and second output terminals of said two amplifiers, output means (13) for providing an output signal (OUT) having a controllable delay with respect to said input signal (IN), a plurality of resistive stages of the type R-2R coupled between said first and second terminals and a plurality of switches controlled by a digital control signal (C) for selecting between said resistive stages in order to linearly vary said controllable delay of said output signal of said resistive-ladder network with respect to said input signal (IN).

2. The circuit of claim 1, wherein:

each of said resistive stages has first, second and third terminals, said first terminal of one of said resistive stages being connected to said second terminal of said resistive-ladder network and said first terminal of the other resistive stages being connected to said second terminal of an adjacent one of said resistive stages, and each of said switches having first, second and third terminals, said first terminal being connected to said digital control signal, said second terminal being connected to said first terminal of said resistive-ladder network and said third terminal being connected to said third terminal of a respective one of said resistive stages.

3. The circuit of claim 1, wherein:

each of said resistive stages has first, second and third terminals, said first terminal of one of said resistive stages being connected to said first terminal of said resistive-ladder network and said first terminal of the other resistive stages being connected to said second terminal of an adjacent one of said resistive stages, each of said switches has first, second and third terminals, said first terminal being connected to said digital control signal, said second terminal being connected to said second terminal of said resistive-ladder network and said third terminal being connected to said third terminal of a respective one of said resistive stages, and said circuit further including a plurality of additional switches (12a) each having first, second and third terminals, with said first terminal connected to said digital control signal (C), said second terminal connected to said first terminal of said resistive-ladder network and said third terminal connected to said third terminal of a respective one of said resistive stages.

4. The circuit of claim 1, further including means for substantially maintaining said resistive-ladder network at a predetermined resistance value despite variations in said controllable delay of said output signal of said resistive-ladder network.

5. The circuit of claim 2, wherein a last one of said other resistive stages of said resistive-ladder network is of a R-R type instead of the R-2R type to provide means for substantially maintaining said resistive-ladder network at a predetermined resistance value despite variations in said digital control signal.

6. The circuit of claim 3, wherein said first terminal of said one of said resistive stages is connected to said first terminal of said resistive-ladder network through a resistance means (R1) having a value of R of said R-2R type of said resistive stages to provide means for substantially maintaining said resistive-ladder network at a predetermined resistance value despite variations in said digital control signal.

7. The circuit of claim 2, wherein said output means of said resistive-ladder network includes common connection means with said second terminals of said switches.

8. The circuit of claim 2, wherein said output means of said resistive-ladder network includes common connection means with said third terminals of said resistive stages.

9. The circuit of claim 3, wherein said output means of said resistive-ladder network includes common connection means of said third terminals of said resistive stages.

10. The circuit of claim 1, wherein said output means includes buffer means.

11. The circuit of claim 10, wherein said input signal and output signal used in said circuit include pulse edges each having a rise time and a fall time and said output means has delay equalizing means for substantially providing said controllable delay during both said rise times and said fall times for said output signal of said resistive-ladder network.

12. The circuit of claim 11, wherein said circuit is integrated into a III-V semiconductor material including field effect transistors using DCFL logic for said two amplifiers, and further wherein said delay equalizing means uses BDCFL logic for said buffer means.

13. The circuit of claim 11, wherein said circuit is integrated into a III-V semiconductor material with field effect transistors, and further wherein said delay equalizing means uses BDCFL logic.

* * * * *